United States Patent
Saitoh

(10) Patent No.: US 11,043,391 B2
(45) Date of Patent: Jun. 22, 2021

(54) ETCHING METHOD AND ETCHING PROCESSING APPARATUS

(71) Applicant: Tokyo Electron Limited, Tokyo (JP)

(72) Inventor: Yusuke Saitoh, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/106,545

(22) Filed: Aug. 21, 2018

(65) Prior Publication Data

US 2019/0067030 A1 Feb. 28, 2019

(30) Foreign Application Priority Data

Aug. 23, 2017 (JP) .............................. JP2017-160546

(51) Int. Cl.

| | |
|---|---|
| *H01L 21/3065* | (2006.01) |
| *H01L 21/311* | (2006.01) |
| *H01L 27/11529* | (2017.01) |
| *H01L 27/11573* | (2017.01) |
| *H01L 21/768* | (2006.01) |
| *H01L 21/67* | (2006.01) |
| *H01L 27/12* | (2006.01) |
| *H01L 27/11575* | (2017.01) |
| *H01J 37/32* | (2006.01) |
| *H01L 27/11582* | (2017.01) |
| *H01L 27/11524* | (2017.01) |

(Continued)

(52) U.S. Cl.
CPC .. *H01L 21/31116* (2013.01); *H01J 37/32165* (2013.01); *H01L 21/67069* (2013.01); *H01L 21/76802* (2013.01); *H01L 27/11529* (2013.01); *H01L 27/11573* (2013.01); *H01L 27/11575* (2013.01); *H01L 27/1207* (2013.01); *H01L 27/1157* (2013.01); *H01L 27/11524* (2013.01); *H01L 27/11556* (2013.01); *H01L 27/11582* (2013.01)

(58) Field of Classification Search
CPC ...................... H01L 21/3065; H01L 21/32136
See application file for complete search history.

(56) References Cited

U.S. PATENT DOCUMENTS

| | | | |
|---|---|---|---|
| 6,255,221 B1 * | 7/2001 | Hudson | ............. H01L 21/31116 216/67 |
| 2013/0059450 A1 | 3/2013 | Le Gouil et al. | |

(Continued)

FOREIGN PATENT DOCUMENTS

| | | |
|---|---|---|
| JP | H08-139077 | 5/1996 |
| JP | 2002-184869 | 6/2002 |

(Continued)

*Primary Examiner* — Thomas T Pham
(74) *Attorney, Agent, or Firm* — IPUSA, PLLC

(57) ABSTRACT

A method of etching silicon-containing film formed on an electrode layer of a floating potential is provided. The etching is performed in a processing vessel while supplying gas, a first high frequency electric power of a first frequency, and a second high frequency electric power of a second frequency less than the first frequency. The method includes a step of supplying, during etching of the silicon-containing film, the first high frequency electric power as a continuous wave and the second high frequency electric power as a pulse wave having a duty cycle of 20% or less, upon a distance from the electrode layer to a bottom of an etching pattern formed on the silicon-containing film becoming not more than a predetermined distance.

6 Claims, 14 Drawing Sheets

(51) Int. Cl.
    *H01L 27/1157*     (2017.01)
    *H01L 27/11556*    (2017.01)

(56) References Cited

U.S. PATENT DOCUMENTS

2017/0162399 A1* 6/2017 Takayama ............... H01L 28/00
2018/0053661 A1* 2/2018 Park ................... H01L 21/3065

FOREIGN PATENT DOCUMENTS

| | | |
|---|---|---|
| JP | 2014-090022 | 5/2014 |
| JP | 2016-219771 | 12/2016 |

* cited by examiner

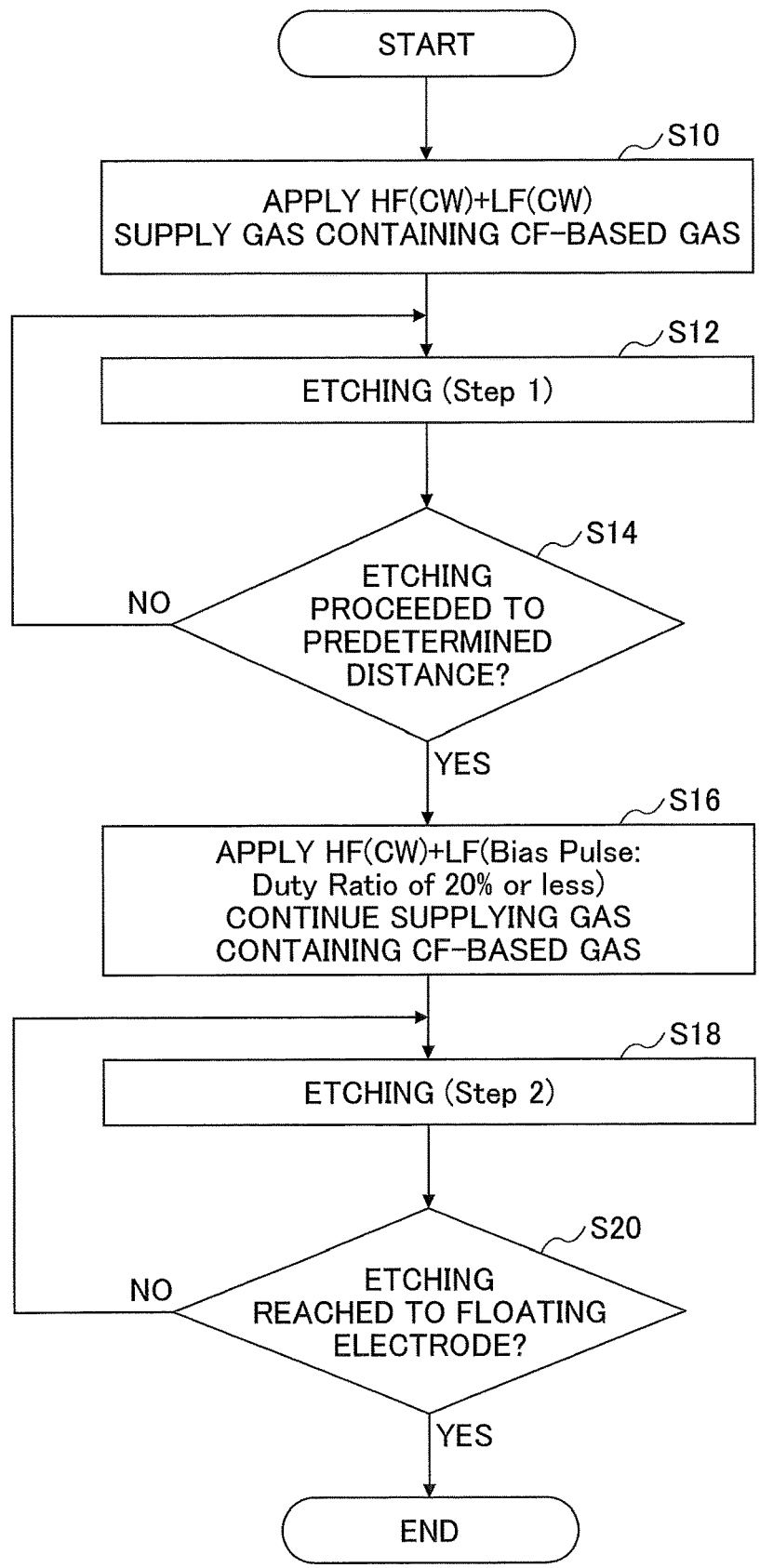

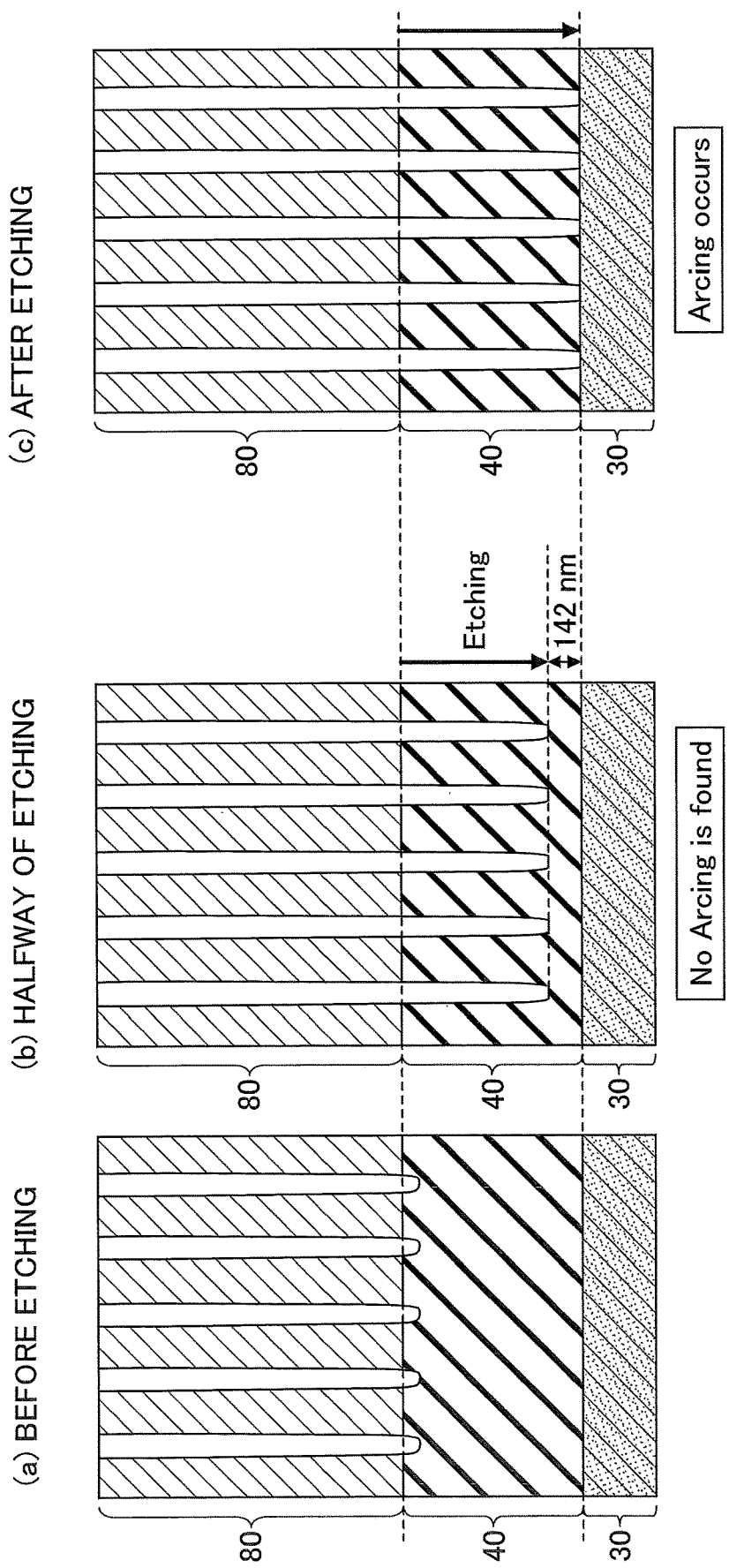

FIG.10B

| | Step 1 | Step 2 | |
|---|---|---|---|
| | CW | Bias Pulse Duty Ratio= 50% | Bias Pulse Duty Ratio= 10% |
| Etching Rate SiO$_2$= 700 nm | 572 nm/min | 335 nm/min | 103 nm/min |
| Mask Selectivity SiO$_2$/Carbon | 5.5 | 3.4 | 2.9 |
| Shading Damage Number of Arcings | 1779 | 1037 | 150 |

ETCHING METHOD AND ETCHING PROCESSING APPARATUS

CROSS-REFERENCE TO RELATED APPLICATIONS

This patent application is based upon and claims the benefit of priority of Japanese Patent Application No. 2017-160546 filed on Aug. 23, 2017, the entire contents of which are incorporated herein by reference.

BACKGROUND OF THE INVENTION

1. Field of the Invention

The present invention generally relates to an etching method and an etching processing apparatus.

2. Description of the Related Art

There is known a technique of forming multiple holes on an insulating layer by etching, which is used in a case in which NAND type flash memory having a 3-dimensional structure (3D-NAND type flash memory) is manufactured (see Patent Documents 1 to 3, for example).

Examples of structures of the 3D-NAND type flash memory are illustrated in FIG. 1A and FIG. 1B. In the 3D-NAND type flash memory illustrated in FIG. 1A, a memory cell part and a peripheral circuit are disposed in parallel. In this case, a bottom layer of the memory cell part and of the peripheral circuit is a conductive layer 10 of a ground potential, which is formed of a silicon substrate.

However, the 3D-NAND type flash memory illustrated in FIG. 1B is configured such that the memory cell part is located above the peripheral circuit to increase degree of integration of a device. In this case, an electrode layer of the memory cell part is apart from the silicon substrate, and thus is a floating electrode 30.

If layered film 60 of the memory cell part, which is formed of silicon oxide film 40 and silicon nitride film 50, is etched, a potential difference between the floating electrode 30 and the conductive layer 10 of a ground potential is caused, and arcing occurs because of an electron shading effect.

As arcing may harm the peripheral circuit, occurrence of arcing needs to be suppressed. However, if etching is performed while reducing power to be supplied in order to suppress the occurrence of the arcing, a desirable etching characteristic, such as an etching rate, may not be obtained.

CITATION LIST

Patent Document

[Patent Document 1] United States Patent Application Publication No. 2013/0059450
[Patent Document 2] Japanese Laid-open Patent Application Publication No. 2016-219771
[Patent Document 3] Japanese Laid-open Patent Application Publication No. 2014-090022

SUMMARY OF THE INVENTION

In one aspect, the present invention aims at reducing occurrence of arcing while maintaining a desired etching characteristic.

To solve the above problem, according to an embodiment of the present invention, a method of etching silicon-containing film formed on an electrode layer of a floating potential is provided. The etching is performed in a processing vessel while supplying gas, a first high frequency electric power of a first frequency, and a second high frequency electric power of a second frequency less than the first frequency. The method includes a step of supplying, during etching of the silicon-containing film, the first high frequency electric power as a continuous wave and the second high frequency electric power as a pulse wave having a duty cycle of 20% or less, upon a distance from the electrode layer to a bottom of an etching pattern formed on the silicon-containing film becoming not more than a predetermined distance.

BRIEF DESCRIPTION OF THE DRAWINGS

FIG. 7 is a flowchart illustrating an example of a flow of the etching process according to the embodiment;

FIG. 8 is a diagram illustrating examples of etching results;

FIGS. 10A and 10B are diagrams illustrating examples of etching characteristics according to the embodiment.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Preface]

Figure 1A:
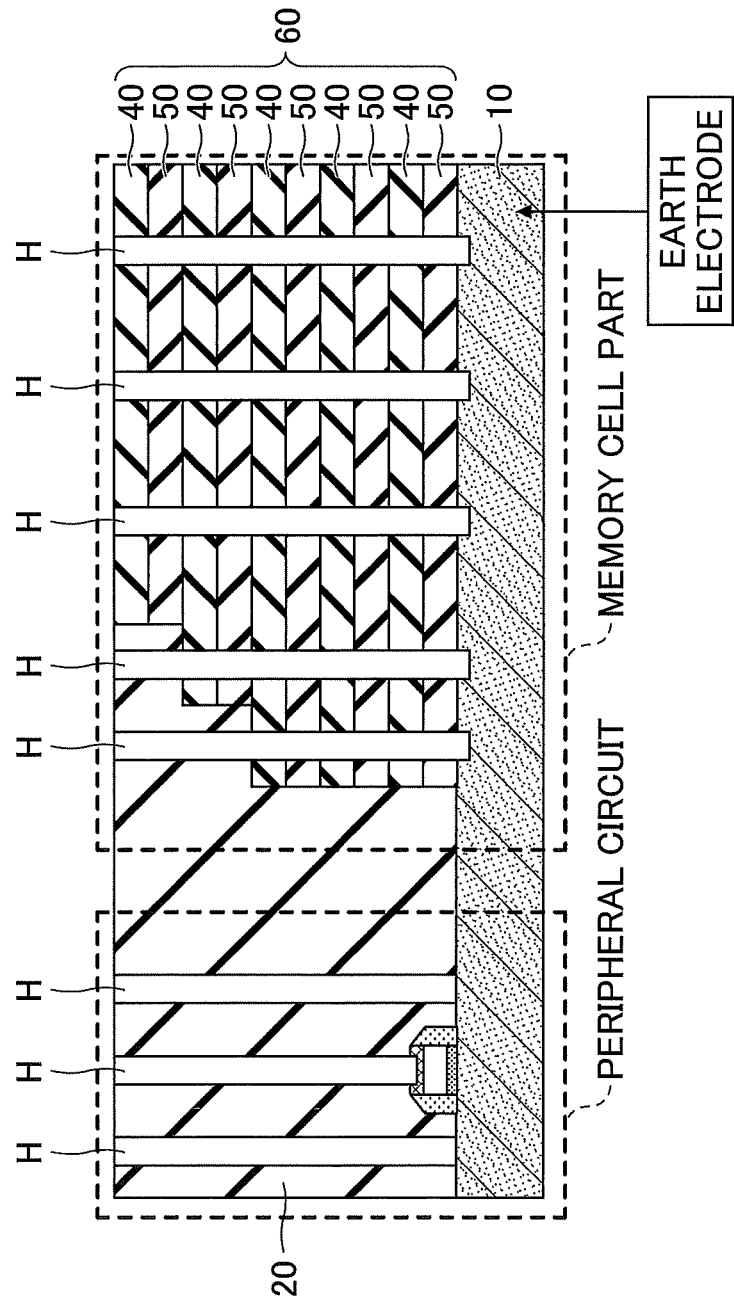
FIGS. 1A and 1B are diagrams illustrating examples of structures of 3D-NAND type flash memories.
Figure 1B:
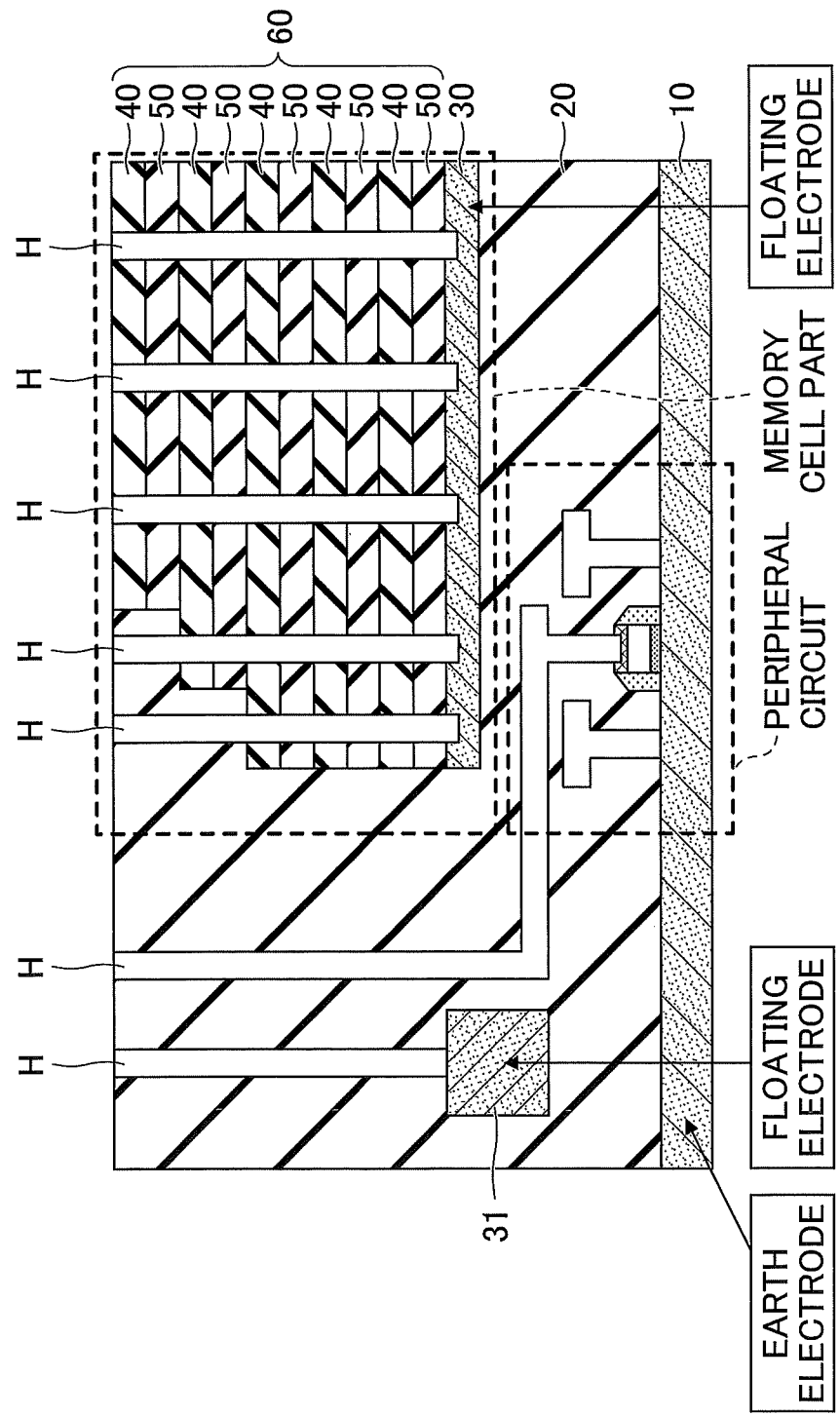

In manufacturing the 3D-NAND type flash memory illustrated in FIG. 1A or 1B, an etching process is performed for forming multiple holes (contact holes) H on the layered film 60 formed of the silicon oxide ($SiO_2$) film 40 and the silicon nitride (SiN) film 50. The etching is applied to both the layered film 60 and silicon oxide film 20 simultaneously.

In the 3D-NAND type flash memory illustrated in FIG. 1A, the memory cell part and the peripheral circuit are disposed in parallel. In this case, as a bottom layer of the memory cell part and of the peripheral circuit is the conductive layer 10 of a ground potential, a potential difference between an electrode of the memory cell and the conductive layer 10 does not occur.

On the other hand, the 3D-NAND type flash memory illustrated in FIG. 1B is configured such that the memory cell part is located above the peripheral circuit to increase degree of integration of a device. In this case, an electrode layer of the memory cell part (may also be referred to as a "floating electrode 30") is apart from the conductive layer 10 of a ground potential, thus resulting in a floating potential.

Figure 2:
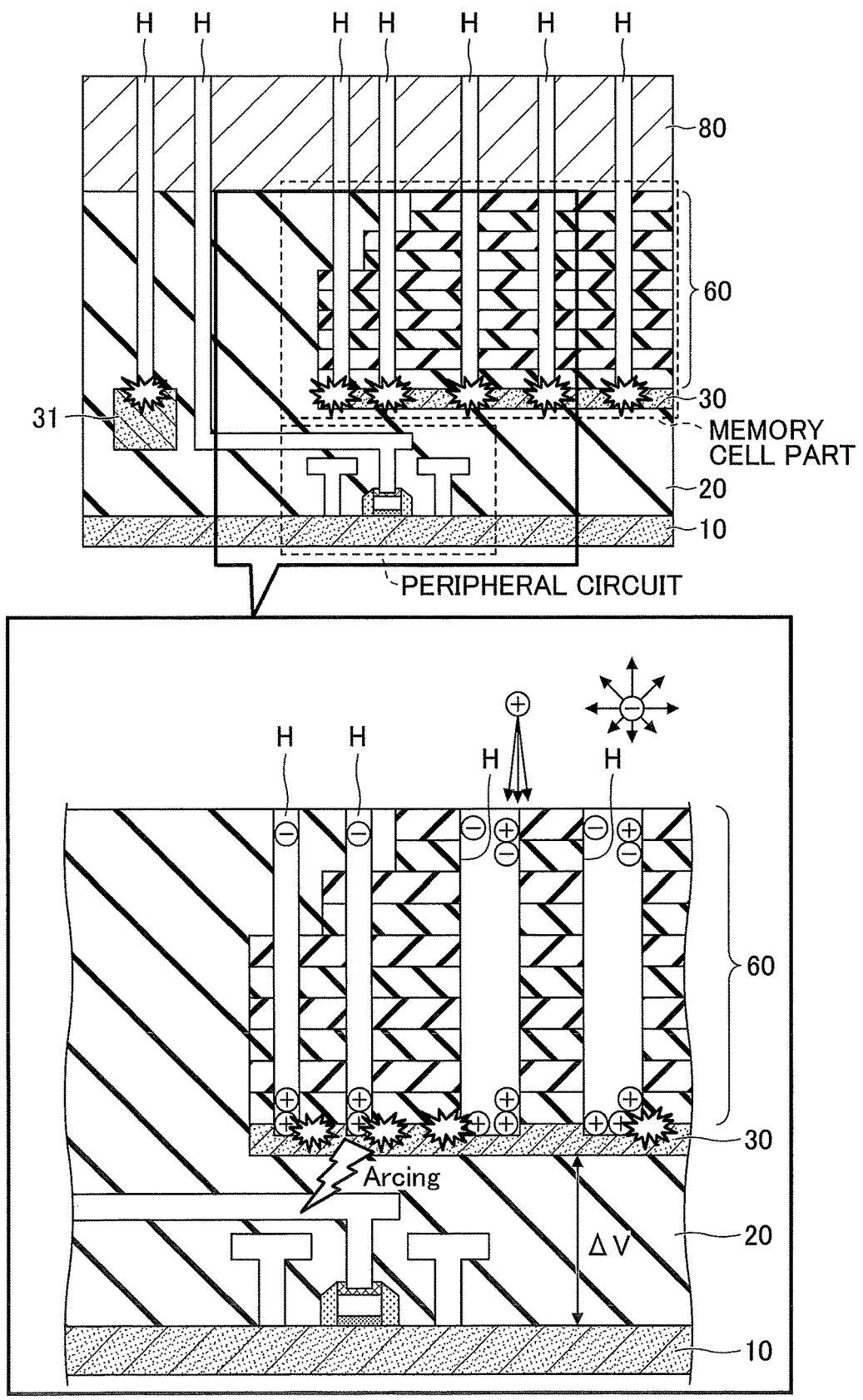
FIG. 2 is a diagram illustrating a mechanism of occurrence of arcing in a 3D-NAND type flash memory.

When the layered film 60 and the silicon oxide film 20 are simultaneously etched, a potential difference ΔV occurs between the floating electrode 30 and the conductive layer 10 (or the floating electrode 31 and the conductive layer 10), as illustrated in FIG. 2. Accordingly, arcing occurs on the floating electrode 30 or 31 because of an electron shading effect.

An enlarged view of a periphery of a bottom of the holes is illustrated at a lower part in FIG. 2. As illustrated in the enlarged view, while ions in plasma enter etching patterns of the holes vertically, electrons in the plasma enter the etching pattern from various directions. Because of the behavior of ions and electrons in the plasma, a phenomenon called the electron shading effect occurs, in which the number of electrons reaching a bottom of a narrow etching pattern covered with a mask (carbon film 80) on the layered film 60 decreases. As a result, because the bottom of the etching pattern is positively charged and a potential difference occurs between the floating electrode 30 and the conductive layer 10 (or the floating electrode 31 and the conductive layer 10), shading damage occurs. Shading damage refers to arcing on a wafer caused by the electron shading effect. If arcing occurs, a peripheral circuit on a wafer W may be damaged.

Therefore, the present embodiment proposes an etching method capable of reducing occurrence of arcing when etching silicon-containing film formed on an electrode layer of a floating potential opposing a silicon substrate which is a conductive layer of a ground potential.

In the following description, an overall configuration of an etching processing apparatus according to the present embodiment will be described first. Subsequently, the etching method according to the present embodiment will be described.

[Overall Configuration of Etching Processing Apparatus]

Figure 3:
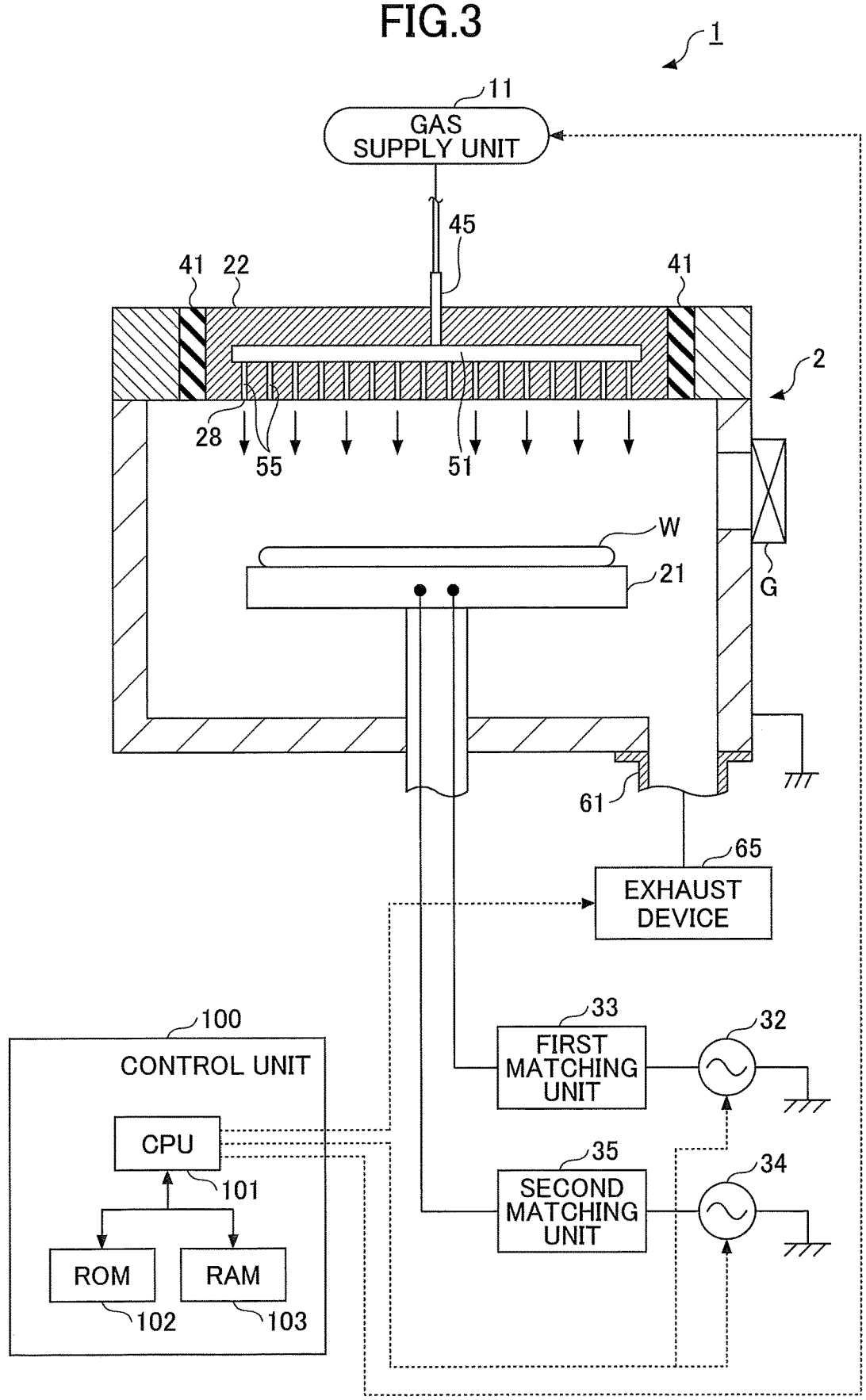
FIG. 3 is a view illustrating an example of a configuration of an etching processing apparatus according to an embodiment.

First, an overall configuration of an etching processing apparatus 1 according to the present embodiment will be described with reference to FIG. 3. In the following description, a configuration of a capacitively coupled type plasma etching apparatus is explained as an example of the etching processing apparatus 1.

The etching processing apparatus 1 according to the present embodiment especially etches a semiconductor wafer W (which may also be referred to as a "wafer W").

The etching processing apparatus 1 includes a processing vessel 2 made from conductive material such as aluminum, and a gas supply unit 11 for supplying gas in the processing vessel 2. The processing vessel 2 is electrically grounded. Inside the processing vessel 2, a lower electrode 21 and an upper electrode 22 are provided. The lower electrode 21 and the upper electrode 22 are disposed in parallel so as to face each other. The lower electrode 21 also acts as a stage for placing a wafer W.

A first high frequency power source 32 is connected to the lower electrode 21 via a first matching unit 33, and a second high frequency power source 34 is connected to the lower electrode 21 via a second matching unit 35. The first high frequency power source 32 applies, to the lower electrode 21, high frequency electric power HF (radio frequency electric power for generating plasma) of more than 27 MHz (such as 100 MHz). The second high frequency power source 34 applies, to the lower electrode 21, high frequency electric power LF (radio frequency electric power for attracting ions) of less than 13 MHz (such as 3 MHz). The high frequency electric power HF may be applied to the upper electrode 22.

The first matching unit 33 is for matching an internal impedance (or output impedance) of the first high frequency power source 32 and a load impedance. The second matching unit 35 is for matching an internal impedance (or output impedance) of the second high frequency power source 34 and a load impedance.

The upper electrode 22 is mounted to a ceiling of the processing vessel 2 through a shield ring 41 covering an outer edge of the upper electrode 22. At the upper electrode 22, a diffusion chamber 51 and a gas inlet 45 for diffusing gas is provided. When gas is output from the gas supply unit 11, the gas is supplied to the diffusion chamber 51 via the gas inlet 45 and diffuses in the diffusion chamber 51. Then the gas passes through gas flow channels 55 and is supplied to a plasma space between the lower electrode 21 and the upper electrode 22, from gas holes 28. As described here, the upper electrode 22 also acts as a gas shower head for supplying gas.

At a bottom of the processing vessel 2, an exhaust port 61 is formed. Gas in the processing vessel 2 is discharged by an exhaust device 65 connected to the exhaust port 61. According to the structure of the processing vessel 2, the inside of the processing vessel 2 can be kept in a desirable quality of vacuum. At a side wall of the processing vessel 2, a gate valve G is provided. Opening and closing of the gate valve G is performed when a wafer W is loaded into the processing vessel 2 or unloaded from the processing vessel 2.

[Hardware Configuration of Control Unit]

A control unit 100 for performing overall control of the etching processing apparatus 1 is provided to the etching processing apparatus 1. The control unit 100 includes a CPU (Central Processing Unit) 101, a ROM (Read Only Memory) 102, and a RAM (Random Access Memory) 103.

The ROM 102 stores basic software (a program) and the like which is executed by the control unit 100. The RAM 103 stores a recipe, which includes control information of the etching processing apparatus 1 corresponding to a process condition (an etching condition). The control information contains a time required for a process, a pressure (of exhaust gas), power or voltage of the high (radio) frequency power source, an amount of flow of each gas, a temperature inside a chamber (such as a temperature of the upper electrode, a temperature of an inner wall of the processing vessel, and a temperature of a wafer W), and the like. Note that the recipe may also be stored in a hard disk drive or a semiconductor memory. Also, the recipe may be stored in a computer-readable removable storage medium such as a CD-ROM or a DVD, and the removable storage medium may be loaded in a predetermined place in an accessible state.

The CPU 101 performs overall control of the etching processing apparatus 1, based on the basic software stored in the ROM 102. The CPU 101 controls an etching process to a wafer W, in accordance with a recipe stored in the RAM 103.

[Number of Arcings occurring during Etching]

The present embodiment introduces a method of reducing damage that occurs because of the electron shading effect during etching of an insulating layer on a floating electrode of a device containing the floating electrode. In the present embodiment, as an example of a device structure including a floating electrode, a 3D-NAND structure is mentioned. However, a device structure to which the method according to the present embodiment can be applied is not limited to a 3D-NAND structure. The method according to the present embodiment can be applied to an etching process of silicon-containing film formed on an electrode layer of a floating potential opposing a conductive layer of a ground potential.

Figure 4:
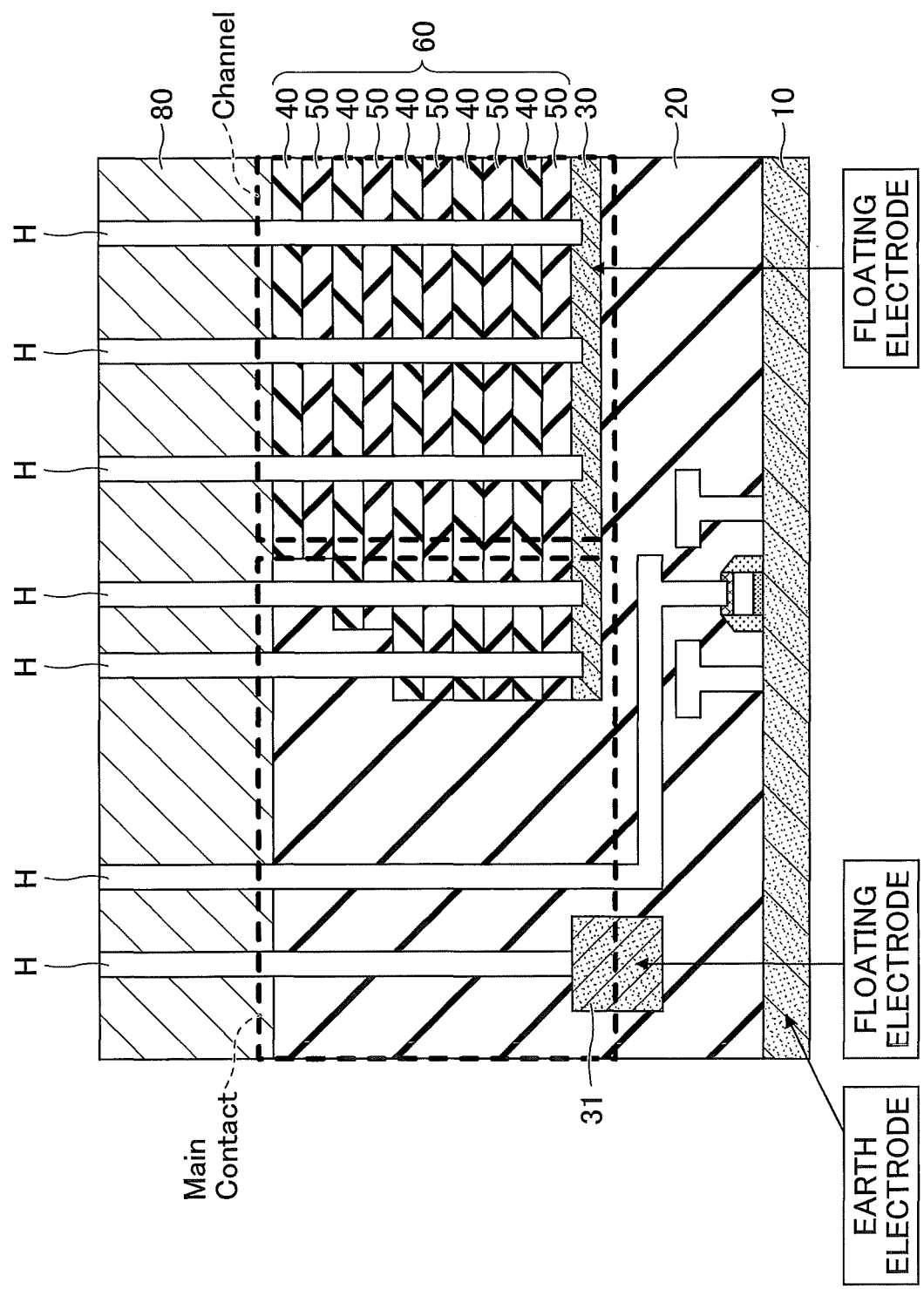
FIG. 4 is a diagram illustrating etching of a device having a 3D-NAND structure according to the embodiment.

When performing etching of a device having the 3D-NAND structure illustrated in FIG. 4, holes (contact holes) H for a floating electrode 31 (Main Contact) and holes (contact holes) H for a floating electrode 30 (Channel) are etched simultaneously.

Figure 5A:
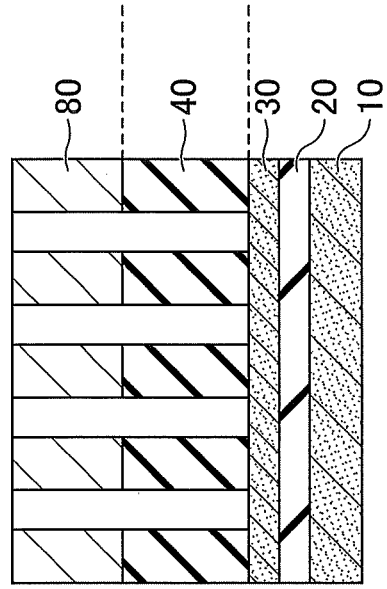
FIGS. 5A to 5C are diagrams illustrating an example of a relation between a bias pulse and arcing.
Figure 5B:
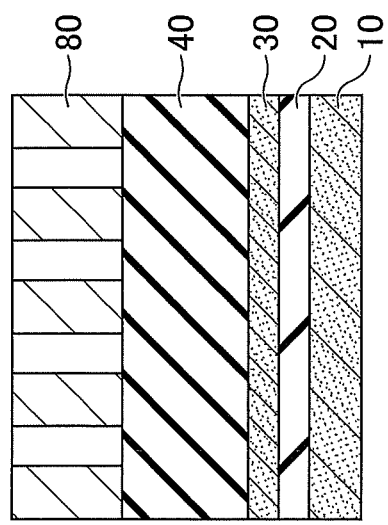

Results of an experiment regarding the number of times of occurrence of arcing during the etching will be described with reference to FIGS. 5A to 5C. In this experiment, etching was applied to a substrate having a film structure as illustrated in FIG. 5A. In FIG. 5A (or 5B), silicon oxide film 40 is a target of etching, carbon film 80 is an etching mask on which a predetermined pattern (mask pattern) is formed, and a layer under the silicon oxide film 40 is a floating electrode 30 made of polysilicon. In this experiment, as illustrated in FIG. 5B, the silicon oxide film 40 was etched in accordance with the mask pattern formed on the carbon film 80, until the floating electrode 30 is exposed. The etching was performed under a process condition (etching condition) described below. During the etching process, the process condition was not changed.

<Process Condition>
Pressure: 20 mTorr (2.666 Pa)
Gas Type: $C_4F_6$ gas, CO gas, and $O_2$ gas
High frequency electric power HF: 600 W (continuous wave), 100 MHz
High frequency electric power LF: 11000 W (continuous wave or pulse wave), 3 MHz
(When the high frequency electric power LF was supplied as a pulse wave, a pulse frequency was from 10 kHz to 50 kHz, and a duty cycle (ratio) was from 5% to 90%)

Note that the "pulse frequency" is a repetition cycle (frequency) of ON/OFF of the high frequency electric power LF.

Because the floating electrode 30 layered on a silicon substrate conductive layer 10 of a ground potential, with silicon oxide film 40 interposed therebetween, is a floating electrode, arcing may occur during the etching process. A graph in FIG. 5C illustrates the number of arcings (the number of times of occurrence of arcing) that has occurred during the experiment. A horizontal axis represents a duty cycle (duty ratio) of the high frequency electric power LF, and a vertical axis represents the number of arcings. The number of arcings is counted by counting the number of vestiges of occurrence of an electric discharge on a wafer W during the experiment. In this experiment, the number of arcings that occurred was measured by varying the duty cycle of the high frequency electric power LF.

Figure 5C:
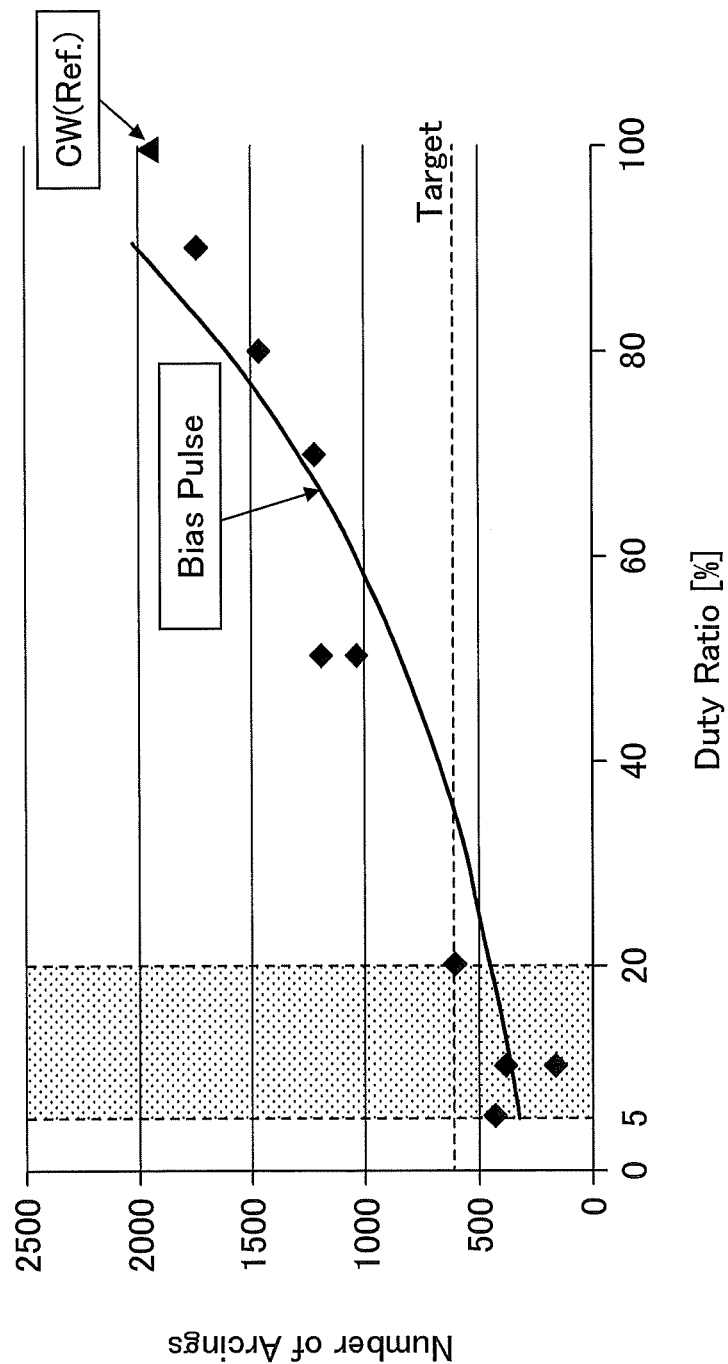

A point labeled as "CW (Ref.)" in FIG. 5C represents the occurred number of arcings when the high frequency electric power LF was a continuous wave (CW) (note that the high frequency electric power HF is a continuous wave in every experiment). The occurred number of arcings when the high frequency electric power LF was a CW is 2000, as illustrated in FIG. 5C. As can be seen from FIG. 5C, the occurred number of arcings when the high frequency electric power LF was a pulse wave (may also be referred to as a "bias pulse") is less than the occurred number of arcings when the high frequency electric power LF was a CW, in every case in which the duty cycle of the bias pulse is between 5% and 90%.

In a case in which an acceptable number of arcings is approximately 600 (may be referred to as a "target"), if the duty cycle of the bias pulse is not more than 20%, the occurred number of arcing is within the acceptable number. Accordingly, as can be seen from FIG. 5C, it was found that a preferable duty cycle is from 5% to 20% when the high frequency electric power LF is applied as a pulse wave.

Figure 6A:
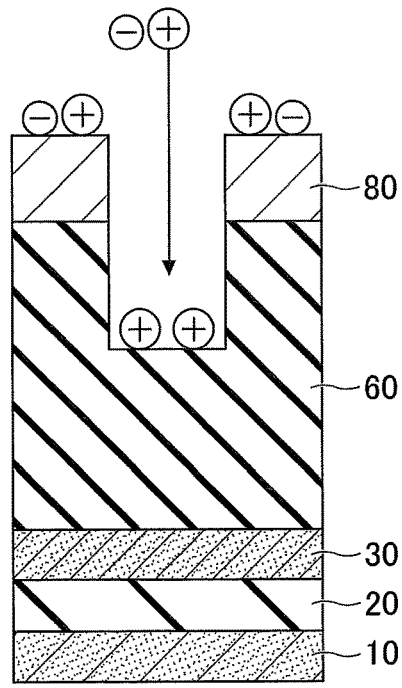
FIGS. 6A to 6C are diagrams illustrating an etching process according to the embodiment.
Figure 6B:
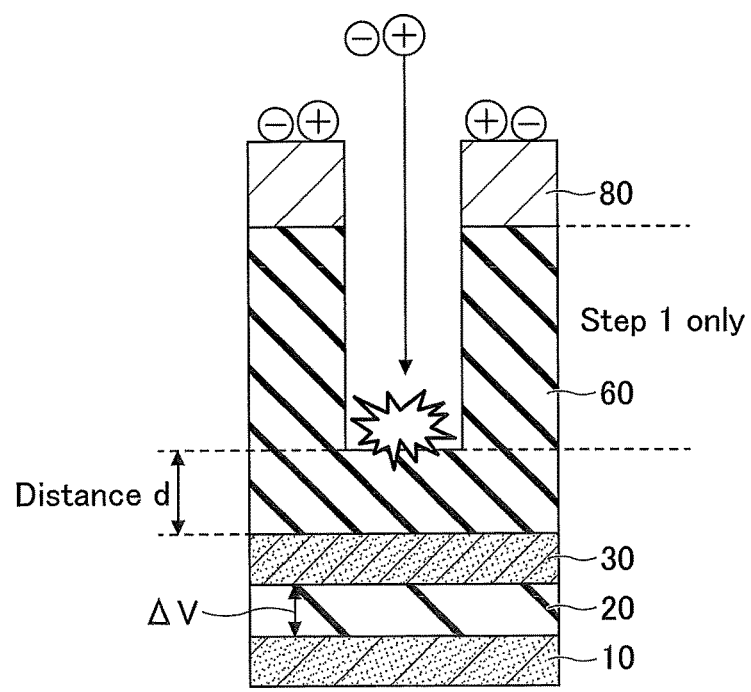

As illustrated in FIG. 6A, positive charged ions are accumulated at a bottom of the etching pattern because of the electron shading effect, as etching proceeds. For example, as illustrated in FIG. 6B, when a gap between the floating electrode 30 made of polysilicon and the bottom of the etching pattern becomes less than a given distance "d", a potential difference $\Delta V$ occurs between the floating electrode 30 and the conductive layer 10 and arcing occurs.

Figure 6C:
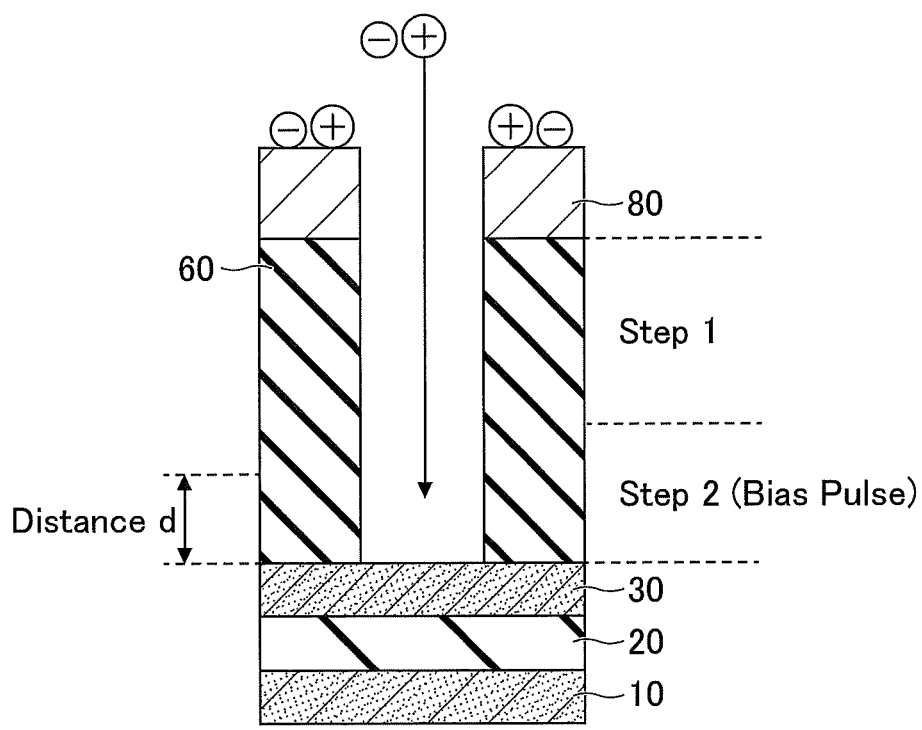

In the present embodiment, as illustrated in FIG. 6C, when the bottom of the etching pattern reaches a point at a distance of "d" from the floating electrode 30 during etching, the high frequency electric power LF to be applied is changed from a continuous wave to a pulse wave, by using the experimental result illustrated in FIG. 5C. That is, in the method according to the present embodiment, a process to be executed is changed, from a first step (Step 1) of applying the high frequency electric power HF as a continuous wave and the high frequency electric power LF as a continuous wave to a second step (Step 2) of applying the high frequency electric power HF as a continuous wave and the high frequency electric power LF as a pulse wave. By changing the process to be executed, an etching method capable of reducing occurrence of arcing can be realized. Note that the distance "d" from the floating electrode 30 to the bottom of the etching pattern, which indicates a timing for changing the applied high frequency electric power LF from a continuous wave to a pulse wave, is determined in advance by performing experiments.

[Etching Process]

Next, the etching process according to the present embodiment will be described with reference to FIG. 7. FIG. 7 is a flowchart illustrating an example of a flow of the etching process according to the present embodiment. The etching process described here is applied to a process for etching the wafer W in which the 3D-NAND structure illustrated in FIG. 4 is formed. A control of the etching process is performed by the control unit 100.

When the etching process is started, the control unit 100 applies the high frequency electric power HF as a continuous wave (CW) and the high frequency electric power LF as a continuous wave (CW) to the lower electrode 21 (step S10). Also at step S10, the control unit 100 supplies gas containing CF-based gas into the processing vessel 2. In the present embodiment, as an example of the gas containing CF-based gas, mixed gas of $C_4F_6$ gas, CO gas, and $O_2$ gas is supplied to the processing vessel 2. By step S10 being executed, plasma is generated from the mixed gas.

Next, the control unit 100 etches the layered film 60 and the silicon oxide film 20 illustrated in FIG. 4 simultaneously, by the generated plasma (step S12: Etching of Step 1). A process condition of the etching performed at step S12 is as stated in the above <Process Condition>, and the high frequency electric power LF is a continuous wave. In the "Etching of Step 1", by employing a continuous wave as both the high frequency electric power HF and the high frequency electric power LF, etching of a high etching rate can be realized by high ion attraction.

Next, the control unit 100 determines whether or not the etching has progressed to a state in which the bottom of the etching pattern reaches a point at a distance of "d" from the floating electrode 30 (step S14). The control unit 100 repeats step S12 and step S14 until the bottom of the etching pattern reaches a point at a distance of "d" from the floating electrode 30.

If it is determined that the bottom of the etching pattern reaches a point at a distance of "d" from the floating electrode 30, the control unit 100 applies, to the lower electrode 21, the high frequency electric power HF as a continuous wave (CW) and the high frequency electric power LF as a pulse wave (bias pulse) whose duty cycle is not more than 20% (step S16). Also, the control unit 100 continues to supply the mixed gas of $C_4F_6$ gas, CO gas, and $O_2$ gas as the gas containing CF-based gas into the processing vessel 2. It is preferable that the control unit 100 applies, to the lower electrode 21, the high frequency electric power LF of a bias pulse whose duty cycle is 5% or more.

Next, the control unit 100 continues to etch the layered film 60 and the silicon oxide film 20 illustrated in FIG. 4, by the generated plasma (step S18: Etching of Step 2). A process condition of the etching performed at step S18 is as stated in the above <Process Condition>. Note that attributes of the high frequency electric power LF are also as stated in the above <Process Condition>. In the "Etching of Step 2", by applying the high frequency electric power HF as a continuous wave and by applying the high frequency electric power LF as a pulse wave, the bottom of the etching pattern can be discharged.

Figure 9:
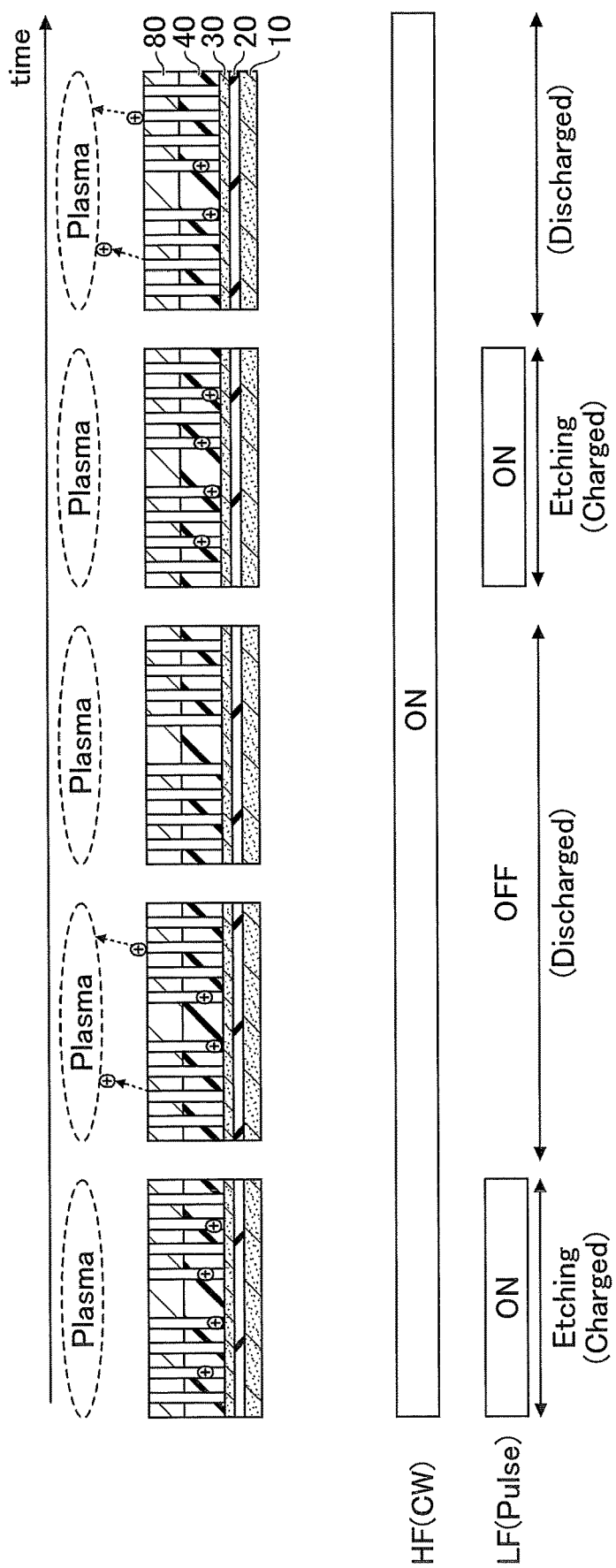
FIG. 9 is a diagram illustrating an effect of the bias pulse according to the embodiment.

As illustrated in FIG. 9, positive charge (ion), which was deposited at a bottom of an etching pattern while the high frequency electric power HF and the high frequency electric power LF are on, is discharged from the bottom of the etching pattern to plasma while the high frequency electric power LF is off. As the discharging is repeated, occurrence of arcing can be prevented.

Next, the control unit 100 determines whether the bottom of the etching pattern has reached the floating electrode 30 (step S20). If it is determined that the bottom of the etching pattern has not reached the floating electrode 30, the process reverts to step S18 and the "Etching of Step 2" is continued. If it is determined that the bottom of the etching pattern has reached the floating electrode 30, the control unit 100 terminates the process.

An example of a result of the etching method according to the present embodiment is illustrated in FIG. 8. The leftmost diagram in FIG. 8 (hereinafter referred to as a "diagram (a)") is an example of a wafer W before etching. A diagram at the center of FIG. 8 (hereinafter referred to as a "diagram (b)") illustrates a state in which etching of the wafer W is in progress. And, the rightmost diagram in FIG. 8 (hereinafter referred to as a "diagram (c)") illustrates a state of the wafer W after the etching was completed. In the etching method according to the present embodiment, during the etching process at step S12, because the high frequency electric power HF of a continuous wave and the high frequency electric power LF of a continuous wave are applied, etching is promoted. Accordingly, as illustrated in the diagram (b) and the diagram (c) of FIG. 8, silicon oxide film 40 of the wafer W is etched in accordance with a pattern formed on carbon film 80. Note that a target of etching in FIG. 8 is the silicon oxide film 40, instead of the above mentioned layered film 60 formed of the silicon oxide film 40 and the silicon nitride film 50.

When the silicon oxide film 40 was etched to a midway of the silicon oxide film 40 by applying the high frequency electric power HF of a continuous wave and the high frequency electric power LF of a continuous wave, as illustrated in the diagram (b) of FIG. 8, no arcing has occurred. A distance from the floating electrode 30 to a bottom of an etching pattern formed on the silicon oxide film 40 by the etching was 142 nm. Subsequently, when the silicon oxide film 40 was etched until the floating electrode 30 was exposed, as illustrated in the diagram (c) of FIG. 8, occurrence of arcing was observed. It is thought that the reason the arcing and shading damage have occurred when the high frequency electric power HF of a continuous wave and the high frequency electric power LF of a continuous wave were applied is that electrical charge deposited at the bottom of the etching pattern was not able to be discharged during etching.

Considering the above result, by performing the etching of step S12 until the bottom of the etching pattern reaches a point at a distance of "d" ("d" is 142 nm, in a case of the diagram (b) in FIG. 8) from the floating electrode 30, and by performing etching of step S18 (applying, to the lower electrode 21, the high frequency electric power LF as a bias pulse having a duty cycle of 20% or less), electrical charge deposited at a bottom of an etching pattern of etching target film can be discharged. Accordingly, etching can be completed while avoiding occurrence of arcing (or while suppressing the number of times of occurrence of arcing to a target number or less).

Figure 10A:
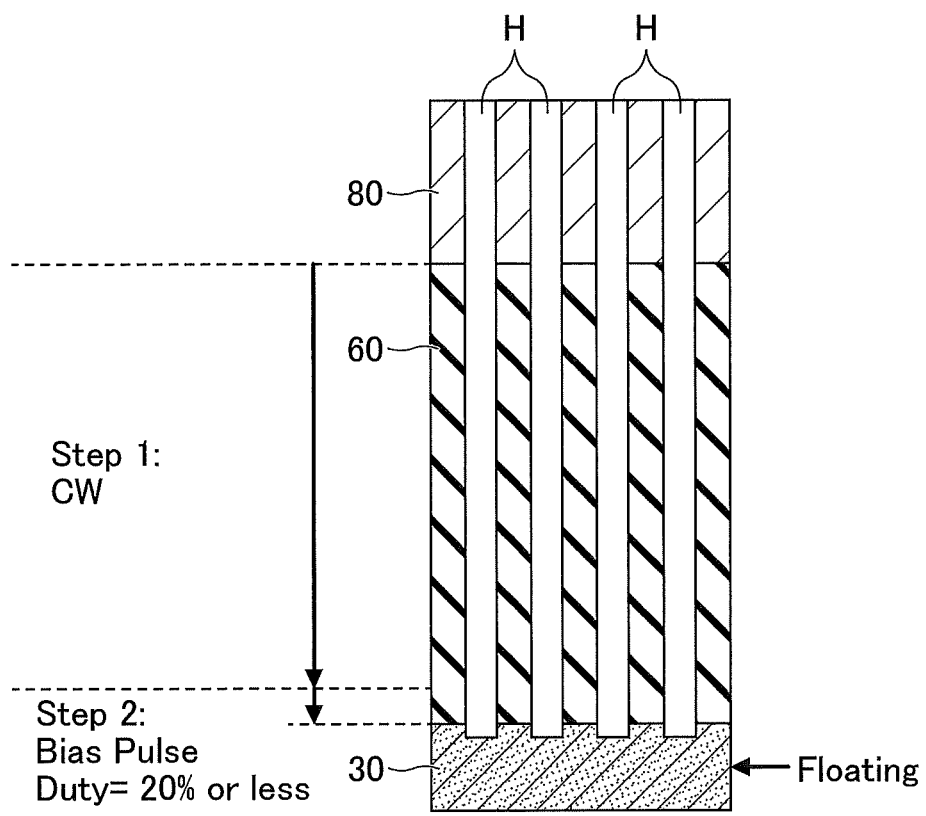

There is a trade-off between an etching rate and shading damage. In the following, experimental results of etching of layered film 60 formed on a floating electrode 30 illustrated in FIG. 10A will be described with reference to FIG. 10B.

When the layered film 60 was etched while applying the high frequency electric power HF of a continuous wave and the high frequency electric power LF of a continuous wave, similar to the "Etching of Step 1", an etching rate was "572 nm/min", and mask selectivity of the layered film 60 with respect to carbon film 80 was "5.5".

Conversely, when the layered film 60 was etched while applying the high frequency electric power HF of a continuous wave and the high frequency electric power LF of a pulse wave, similar to the "Etching of Step 2", the etching rate was "103 nm/min", and the mask selectivity of the layered film 60 with respect to carbon film 80 was "2.9", both of which were lower than in the former experiment. However, the shading damage (the number of arcings) occurred in this experiment was approximately 1/12 of that in the former experiment.

As described above, as a time of "Etching of Step 2" becomes longer with respect to a time of "Etching of Step 1", a total etching rate decreases such that etching characteristics are reduced. Accordingly, it is preferable that the "Etching of Step 1" is performed as long as arcing does not occur. That is, the distance "d" from a floating electrode to a bottom of an etching pattern is preferably set to a minimum such that arcing does not occur and such that withstand voltage can be assured even though the bottom of the etching pattern is charged.

According to the present embodiment, an etching process is executed in two steps (the "Etching of Step 1", and the "Etching of Step 2"). In the "Etching of Step 2", the high frequency electric power LF is applied as a bias pulse having a duty cycle of not less than 5% and not more than 20%. By performing the "Etching of Step 2", etching can be performed while discharging a bottom of an etching pattern. As a result, occurrence of arcing can be reduced while maintaining desired etching characteristics such as an etching rate. Also, in the present embodiment, a minimum distance from a floating electrode to a bottom of an etching pattern, in which arcing does not occur, is predetermined. If a distance from a floating electrode to a bottom of an etching pattern reaches the predetermined minimum distance while the "Etching of Step 1" is being executed, the "Etching of Step 1" is replaced by the "Etching of Step 2". As a result, occurrence of arcing can be reduced while maintaining desired etching characteristics such as an etching rate or selectivity.

Modified Example

The etching method of etching layered film 60 formed on a floating electrode 30 in a 3D-NAND structure has been described above. However, a device structure to which the etching method according to the present embodiment can be applied is not limited to a 3D-NAND structure. The etching method according to the present embodiment can be applied to an etching process of silicon-containing film formed on an electrode layer of a floating potential opposing a conductive layer of a ground potential. That is, it is preferable that the etching method according to the present embodiment is applied to a structure having an electrically floating electrode in insulating film to etch the insulating film.

Examples of the silicon-containing film may include, in addition to $SiO_2$ film, SiN film, or layered film formed of $SiO_2$ film and SiN film, carbon-containing silicon oxide film or carbon-containing silicon nitride film, such as SiC film, SiCN film, SiCO film, or SiOCH film, or may include layered film formed of carbon-containing silicon oxide film and carbon-containing silicon nitride film. Further, the silicon-containing film may be multilayer film including multiple layers of films selected from the group consisting of silicon oxide film, silicon nitride film, carbon-containing silicon oxide film, and carbon-containing silicon nitride film.

Also, a conductive layer of a ground potential is not limited to polysilicon (Poly-Si). The conductive layer may be a monocrystal of silicon (Si), or silicon doped with boron.

In the present embodiment, as an example of a mask, carbon film 80 is mentioned. However, examples of the mask may also include Poly-Si mask, W (tungsten) mask, TiN mask, or organic mask.

In the "Etching of Step 1" according to the above mentioned embodiment, silicon-containing film is etched while the high frequency electric power HF of a continuous wave and the high frequency electric power LF of a continuous wave are supplied. However, a method of Etching of Step 1 is not limited to the above mentioned method. In the "Etching of Step 1", silicon-containing film may be etched while the high frequency electric power HF of a continuous wave and the high frequency electric power LF of a pulse wave having a duty cycle of not less than 50% are supplied.

Further, in the above mentioned embodiment, when the high frequency electric power LF applied is a pulse wave, a pulse frequency of the pulse wave is not less than 10 kHz and not more than 50 kHz. However, a pulse frequency used as a pulse wave of the high frequency electric power LF is not limited to the above. Any type of pulse wave may be used as the high frequency electric power LF, as long as pulse frequencies of the pulse waves are not less than 0.1 kHz and not more than 50 kHz.

In the above embodiment, an etching method has been described. However, an etching method according to the present invention is not limited to the above embodiment. Various changes or enhancements can be made hereto within the scope of the present invention. Matters described in the above embodiments may be combined unless inconsistency occurs.

The etching processing apparatus according to the present invention can be applicable to any type of etching processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, the semiconductor wafer W is referred to as an example of a substrate. However, the substrate processed by the etching processing apparatus is not limited to the semiconductor wafer W. Examples of the substrate may include various types of substrates used in an LCD (Liquid Crystal Display) or a FPD (Flat Panel Display), a photomask, a CD substrate, or a printed circuit board.

What is claimed is:

1. A method of etching silicon-containing film formed above a substrate, the etching being performed in a processing vessel while supplying gas, a first electric power of a first frequency, and a second electric power of a second frequency less than the first frequency, the processing vessel including a lower electrode on which the substrate is placed during etching of the silicon-containing film, and including an upper electrode facing the lower electrode, the processing vessel being configured to supply the first electric power to the lower electrode or the upper electrode, and to supply the second electric power to the lower electrode, the silicon-containing film being formed on an electrode layer of a floating potential, the method comprising:
    supplying, during etching of the silicon-containing film, the first electric power as a continuous wave and the second electric power as the continuous wave or as a pulse wave having a duty cycle of 50% or more, while a distance from the electrode layer to a bottom of an etching pattern formed on the silicon-containing film is larger than a predetermined distance; and
    supplying, during the etching of the silicon-containing film, the first electric power as the continuous wave and the second electric power as the pulse wave having the duty cycle of 20% or less, when the distance from the electrode layer to the bottom of the etching pattern formed on the silicon-containing film becomes not larger than the predetermined distance; wherein
    a magnitude of the second electric power supplied while the distance from the electrode layer to the bottom of the etching pattern is larger than the predetermined distance is a same as a magnitude of the second electric power supplied after the distance from the electrode layer to the bottom of the etching pattern becomes not larger than the predetermined distance.

2. The method according to claim 1, wherein a pulse frequency of the pulse wave is not less than 0.1 kHz and not more than 50 kHz.

3. The method according to claim 1, wherein the silicon-containing film is single layer film or multilayer film including one or more layers of films selected from a group consisting of silicon oxide film, silicon nitride film, carbon-containing silicon oxide film, and carbon-containing silicon nitride film.

4. The method according to claim 1,
    wherein, when the distance from the electrode layer to the bottom of the etching pattern formed on the silicon-containing film becomes not larger than the predetermined distance, the second electric power is changed to a pulse wave having a duty cycle of not less than 5% and not more than 20%.

5. The method according to claim 4, wherein a pulse frequency of the pulse wave of the second electric power is not less than 0.1 kHz and not more than 50 kHz.

6. The method according to claim 5, wherein the silicon-containing film is single layer film or multilayer film including one or more layers of films selected from a group consisting of silicon oxide film, silicon nitride film, carbon-containing silicon oxide film, and carbon-containing silicon nitride film.

* * * * *